(12) United States Patent
Peschke (10) Patent No.: US 10,809,282 B2
(45) Date of Patent: Oct. 20, 2020

(54) MULTI-LEVEL LOGIC ANALYZER FOR ANALYZING MULTI-LEVEL DIGITAL SIGNALS AND METHOD FOR OPERATING A MULTI-LEVEL LOGIC ANALYZER FOR ANALYZING MULTI-LEVEL DIGITAL SIGNALS

(71) Applicant: Rohde & Schwarz GmbH & Co. KG, Munich (DE)

(72) Inventor: Martin Peschke, Vaterstetten (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 249 days.

(21) Appl. No.: 15/823,841

(22) Filed: Nov. 28, 2017

(65) Prior Publication Data
US 2018/0275170 A1    Sep. 27, 2018

(30) Foreign Application Priority Data

Mar. 23, 2017   (EP) ..................................... 17162481

(51) Int. Cl.
*G01R 13/02*   (2006.01)
*G01R 29/02*   (2006.01)
(Continued)

(52) U.S. Cl.
CPC ..... *G01R 13/0272* (2013.01); *G01R 13/0236* (2013.01); *G01R 29/02* (2013.01); *G01R 31/3177* (2013.01); *H04L 25/4917* (2013.01)

(58) Field of Classification Search
CPC ............ G01R 13/0272; G01R 13/0236; G01R 31/3177; G01R 29/02; G01R 31/00; H04L 25/4917
See application file for complete search history.

(56) References Cited

U.S. PATENT DOCUMENTS 5,177,483 A  *  1/1993  Boutigny ......... G01R 19/16557
                                                        341/159
7,215,721 B2    5/2007  Hietala et al.
(Continued)

FOREIGN PATENT DOCUMENTS

DE       32 120 622 A1   12/1982
EP         1384338 B1    12/2010
(Continued)

OTHER PUBLICATIONS

Extended European Search Report for European Patent Application No. 17162481.0, dated Oct. 2, 2017, 9 pages.

*Primary Examiner* — Regis J Betsch
*Assistant Examiner* — Jeremy A Delozier
(74) *Attorney, Agent, or Firm* — Westman, Champlin & Koehler, P.A.

(57) ABSTRACT

A multi-level logic analyzer for analyzing multi-level digital signals comprises a plurality of signal inputs, each signal input being configured to receive a multi-level digital signal, a plurality of comparison units, each comparison unit comprising a first comparator input and a second comparator input and being configured to compare a signal received at the first comparator input with a signal received at the second comparator input, and first switching means configured to couple at least one of the signal inputs with the first comparator inputs of at least two of the comparison units.

12 Claims, 5 Drawing Sheets

(51) Int. Cl.
    *G01R 31/3177*     (2006.01)
    *H04L 25/49*     (2006.01)

(56) References Cited

U.S. PATENT DOCUMENTS

| | | | |
|---|---|---|---|
| 7,602,860 B2 | 10/2009 | Hietala et al. | |
| 9,035,815 B1* | 5/2015 | Lowney | H03M 1/50 |
| | | | 341/155 |
| 2002/0196510 A1 | 12/2002 | Hietala et al. | |
| 2004/0008052 A1 | 1/2004 | Sakaguchi et al. | |
| 2007/0171998 A1 | 7/2007 | Hietala et al. | |
| 2013/0156126 A1* | 6/2013 | Chung | H04L 27/06 |
| | | | 375/268 |

FOREIGN PATENT DOCUMENTS

| | | | |
|---|---|---|---|
| JP | H05-249190 A | 9/1993 | |
| JP | H10-2937 A | 1/1998 | |

* cited by examiner

MULTI-LEVEL LOGIC ANALYZER FOR
ANALYZING MULTI-LEVEL DIGITAL
SIGNALS AND METHOD FOR OPERATING
A MULTI-LEVEL LOGIC ANALYZER FOR
ANALYZING MULTI-LEVEL DIGITAL
SIGNALS

CROSS-REFERENCE TO RELATED
APPLICATION(S)

This application claims priority to European Patent Application No. 17162481.0, filed on Mar. 23, 2017, which is hereby incorporated by reference in its entirety.

TECHNICAL FIELD

The present invention relates to a multi-level logic analyzer for analyzing multi-level digital signals. The present invention further relates to a method for operating a multi-level logic analyzer.

BACKGROUND

Although applicable in principal to any measurement system, the present invention and its underlying problem will be hereinafter described in combination with oscilloscopes.

In today's modern electronic industry a variety of different measurements and tests must be performed on electronic products during development and production.

For example oscilloscopes maybe used to record analogue voltage and/or current values. In addition, some oscilloscopes or logic analyzers allow recording logic values, where the logic state, i.e. true/false, 1/0 or on/off, is recorded. Such logic values only show the logical content of the signals but cannot represent the waveform any more.

If a device under test uses multi-level signals, like e.g. PAM3 signals with three logic states, these signals may e.g. be recorded with an analogue input of an oscilloscope and the user may manually evaluate the different signal levels or provide the recorded signal levels from the oscilloscope e.g. to a computer to perform an automated evaluation. The oscilloscope may also provide a multi-level signal evaluation after recording the signal via an analogue input or channel.

Against this background, the problem addressed by the present invention is providing an improved measurement of multi-level signals.

SUMMARY

The present invention solves this object by a multi-level logic analyzer with the features of claim 1, and by a method for operating a multi-level logic analyzer with the features of claim 10.

Accordingly it is provided:
A multi-level logic analyzer for analyzing multi-level digital signals, the multi-level logic analyzer comprising a plurality, i.e. two or more, of signal inputs, each signal input being configured to receive a multi-level digital signal, a plurality, i.e. two or more, of comparison units, e.g. comparators, each comparison unit comprising a first comparator input and a second comparator input and being configured to compare a signal received at the first comparator input with a signal received at the second comparator input, and first switching means configured to couple at least one of the signal inputs with the first comparator inputs of at least two of the comparison units.

Further, it is provided:
A method for operating a multi-level logic analyzer for analyzing multi-level digital signals, the method comprising receiving multi-level digital signals, each with a signal input, controllably coupling at least one of the signal inputs with first comparator inputs of at least two comparison units, each comparison unit comprising a first comparator input and a second comparator input, and comparing the signal received at the first comparator input of a respective comparison unit with a signal received at the second comparator input of a respective comparison unit.

The present invention provides a multi-level logic analyzer with a plurality of signal inputs. Plurality in this context may refer to any number larger than one. Further, the multi-level logic analyzer provides a plurality of comparison units that compare two signals at their inputs.

In addition, first switching means may couple the single signal inputs each with at least two of the comparison units.

This arrangement of the multi-level logic analyzer allows analyzing multi-level signals without the need to use e.g. an analogue channel of an oscilloscope. The number of analogue channels on an oscilloscope is usually limited, e.g. to four. With the present invention these analogue channels may be reserved for analogue measurements and the multi-level signals may be measured via the multi-level logic analyzer that may e.g. be integrated into an oscilloscope or the like.

The first switching means may e.g. couple a single signal input to as many comparison units as the signal has logic levels or signal levels. If for example a signal is a PAM3 signal with three logic levels, the respective signal input may be coupled to two of the comparison units. Only two of the comparison units are needed, since one of the signal levels is the zero level.

The two comparison units may then e.g. have different switching levels that represent the logic levels of the input signal. If the logic level of the input signal is the first or lowest logic level, none of the comparison units will output a signal or they will output a zero or low signal. If the logic level of the input signal is the second level, only the first of the comparison units will output a positive signal. If the logic level of the input signal is the third level, both of the comparison units will output a positive signal.

The output of the comparison units may then further be processed to evaluate the number of positive outputs and determine the signal level of the multi-level signal.

The comparison units may e.g. be comparators or subtractors and the first comparator inputs may be the positive inputs of the comparators or subtractors, and the second comparator inputs may be the negative inputs of the comparators or subtractors. This will lead to an inverse output. The signal inputs may also be switched. This will provide a normal or non-inverted output.

Further embodiments of the present invention are subject of the further subclaims and of the following description, referring to the drawings.

In a possible embodiment, the multi-level logic analyzer may comprise a plurality, i.e. two or more, of signal outputs, each signal output being configured to output an output signal.

The signal outputs may provide the output signals to following signal processing units. In addition, the signal outputs may perform any kind of signal conditioning. The signal outputs may output any kind of signal, like e.g. an analogue or a digital serial or parallel signal.

In a possible embodiment, the multi-level logic analyzer may comprise second switching means configured to controllably couple comparison units that are coupled on their first comparison input with the same signal input on their output side with one of the signal outputs.

If different comparison units are coupled to a single signal input, they may each serve to analyze a different level of the multi-level logic signal that is provided as input signal to the respective signal input. Coupling all of these comparison units to a single output allows providing a following signal processing unit with a single signal that represents the different signal levels of the multi-level input signal.

In a possible embodiment, the signal outputs may comprise an encoder that is configured to encode output signals of the comparison units that are connected to the respective signal output into binary values or serialize the output signals of the respective comparison units.

As already described above, in an exemplary embodiment the number of comparison units that show a positive or high value represents the momentary level present at the multi-level input signal. Therefore, encoding this number into a binary value or a serial digital signal allows providing the following signal processing unit with an indication of the momentary level of the multi-level input signal that is easily usable in digital systems.

In a possible embodiment, the second switching means may further be configured to controllably couple comparison units that are coupled on their input side with a single signal input on their output side with different signal outputs.

This allows providing the results of the single comparison units as a raw signal to a following signal processing unit and performing any type of analysis on these raw signals in the following signal processing unit.

In a possible embodiment, the multi-level logic analyzer may comprise a plurality, i.e. two or more, of configurable threshold voltage sources, each threshold voltage source being configured to provide a configured output voltage.

The configurable threshold voltage sources may serve in the multi-level logic analyzer to provide the comparison units with respective threshold voltages as a basis for performing the comparison of the multi-level input signal to determine the momentary level of the multi-level input signal. This means that the comparison units will compare the respective threshold voltage with the input signal provided to the respective comparison unit.

In a possible embodiment, the multi-level logic analyzer may comprise a plurality, i.e. two or more, of third switching means being configured to couple one of the threshold voltage sources with at least two of the comparison units, especially when the respective two of the comparison units are coupled to different signal inputs.

If two of the comparison units are provided with the same threshold voltage, their output will be triggered by the same signal levels on the input sides. Therefore, two different input signals at two different signal inputs may be compared with the same threshold voltage.

In a possible embodiment, the threshold voltage sources may be configured to each output a different threshold voltage.

Since the threshold voltage sources are configurable, it is possible to configure each one of the threshold voltage sources according to a predetermined signal level of the received multi-level signal.

For example, for a three level multi-level signal two of the threshold voltage sources may be configured to provide threshold voltages, which are in the middle of the voltage range between the respective voltage levels of the multi-level signal.

If for example a first level of the of the multi-level signal is 0 V, a second level of the multi-level signal is 2.5 V and a third level of the multi-level signal is 5 V, a first threshold voltage source could be configured to provide 1.25 V, and a second threshold voltage source could be configured to provide 3.75 V.

In a possible embodiment, the first switching means may further be configured to couple one of the signal inputs with a first comparator input of one of the comparison units and one of the signal inputs with the second comparator input of the respective comparison unit.

If two signal inputs are connected to the same comparison unit, e.g. a subtractor like a differential amplifier or the like, but each to a different comparator input of the comparison unit, it is possible to measure differential signals. It is understood, that the signal inputs may be coupled to various different comparison units at the same time and that differential multi-level signals may be processed with the present invention.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

Figure 1:
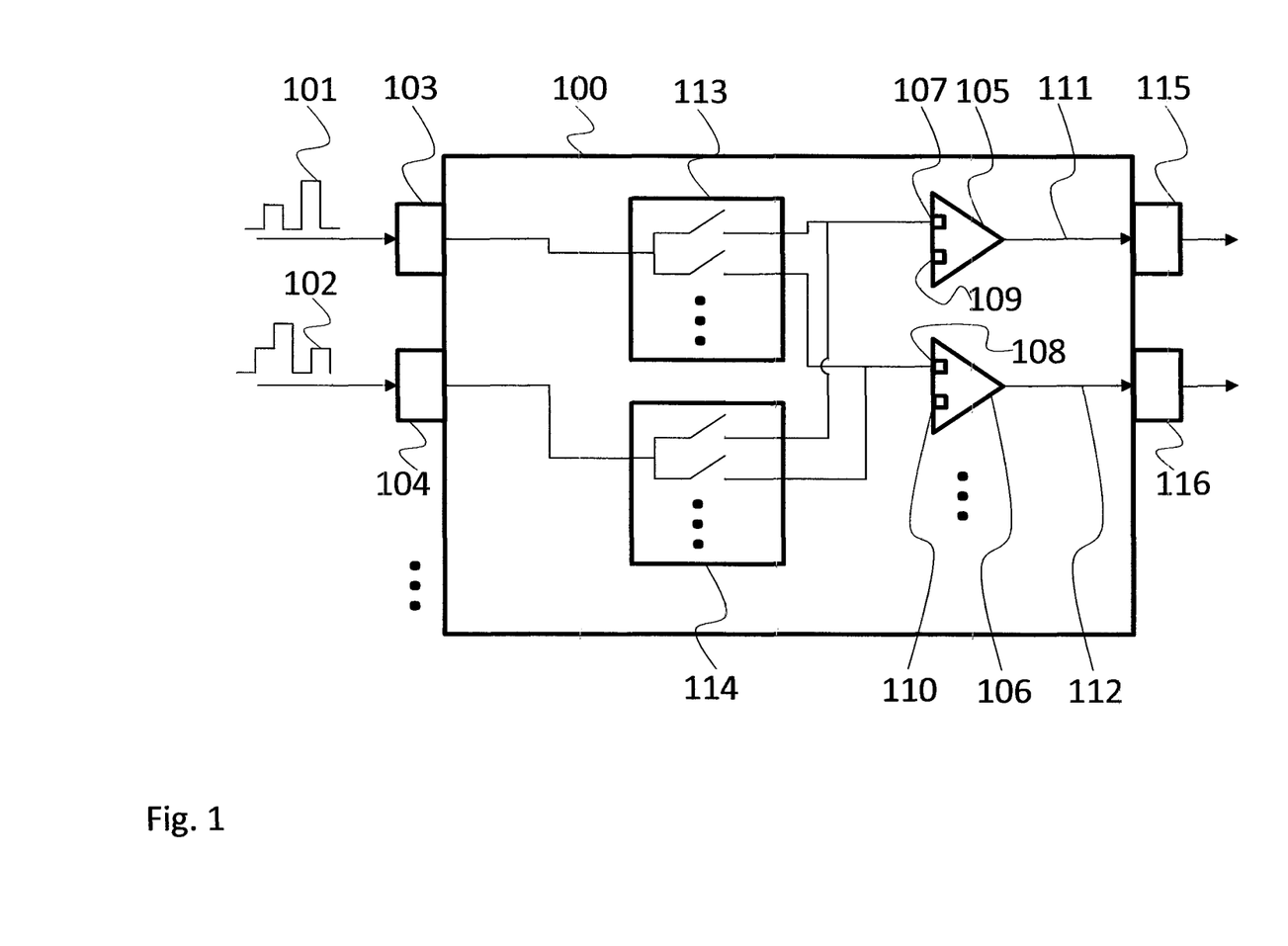
FIG. 1 shows a block diagram of an embodiment of a multi-level logic analyzer according to the present invention.

FIG. 1 shows a block diagram of a multi-level logic analyzer 100 for analyzing multi-level digital signals 101, 102. The multi-level digital signals 101, 102 shown in FIG. 1 just exemplarily comprise three voltage levels. It is however understood that the present invention may be applied to multi-level digital signals with any number of signal levels.

The multi-level logic analyzer 100 comprises a plurality of signal inputs, wherein only two signal inputs 103, 104 are shown and further signal inputs are hinted at by three dots. The multi-level logic analyzer 100 further comprises for every one of the signal inputs 103, 104 a first switching means 113, 114. As with the signal inputs 103, 104 only two first switching means 113, 114 are shown and further first switching means are hinted at by three dots. In addition, the multi-level logic analyzer 100 comprises a plurality of comparison units 105, 106, wherein only two are shown and further comparison units are hinted at by three dots. The comparison units 105, 106 are coupled to respective signal outputs 115, 116 to provide their comparator outputs 111, 112 e.g. to a following signal processing unit (not shown).

The first switching means 113, 114 each receive one of the multi-level digital signals 101, 102. The first switching means 113, 114 may then forward the multi-level digital signals 101, 102 to at least two of the comparison units 105, 106, depending on the number of signal levels of the multi-level digital signals 101, 102. The first switching means 113, 114 will especially forward the multi-level digital signals 101, 102 to as many comparison units 105, 106 as are needed to process all signal levels of the multi-level digital signals 101, 102, e.g. one less than the number of signal levels.

For example the first switching means 113 may forward the multi-level digital signal 101 to the two shown first switching means 113, 114. The first switching means 114 may forward the multi-level digital signal 102 to two further not shown comparison units. This allows the multi-level logic analyzer 100 to process multiple multi-level digital signals 101, 102 at the same time with simple switches and comparators.

The comparison units 105, 106 may receive the multi-level digital signal 101 via a first comparator input 107, 108. A comparison voltage selected according to the signal levels of the multi-level digital signal 101 may be provided on the second comparator inputs 109, 110. The comparison units 105, 106 may e.g. provide a positive output, if the signal level on the first comparator input 107, 108 is higher than the signal level on the second comparator input 109, 110. The comparison voltage of the first switching means 113 may e.g. be between the first and the second signal level of the multi-level digital signal 101, and the comparison voltage of the first switching means 114 may e.g. be between the second and the third signal level of the multi-level digital signal 101.

This means that both comparison units 105, 106 provide a negative or low signal, when the multi-level digital signal 101 has the first signal level. The comparison unit 105 will provide a positive output, when the multi-level digital signal 101 has the second signal level, and both comparison units 105, 106 will provide a positive output signal, when the multi-level digital signal 101 has the third signal level.

The above may be applied to any number of multi-level digital signals 101, 102 and any number of signal levels. The first switching means 113, 114 may e.g. be provided with a number of switching elements that is as high as the maximum number of signal levels that have to be analyzed.

It is therefore not necessary to use e.g. an analogue channel of an oscilloscope to perform multi-level measurements.

It is understood, that the first switching means 113, 114 may e.g. be combined into a switching matrix that may comprise any number of switches, like e.g. digitally controllable switches. It is further understood, that the multi-level logic analyzer 100 may comprise any further elements, like e.g. filters, amplifier, and attenuators that are necessary to receive or output the multi-level digital signals 101, 102 or the comparator output signals 111, 112. In addition, the multi-level logic analyzer 100 may comprise a control unit that configures the first switching means 113, 114 and any other configurable element of the multi-level logic analyzer 100 e.g. based on test parameters or a user input.

Figure 2:
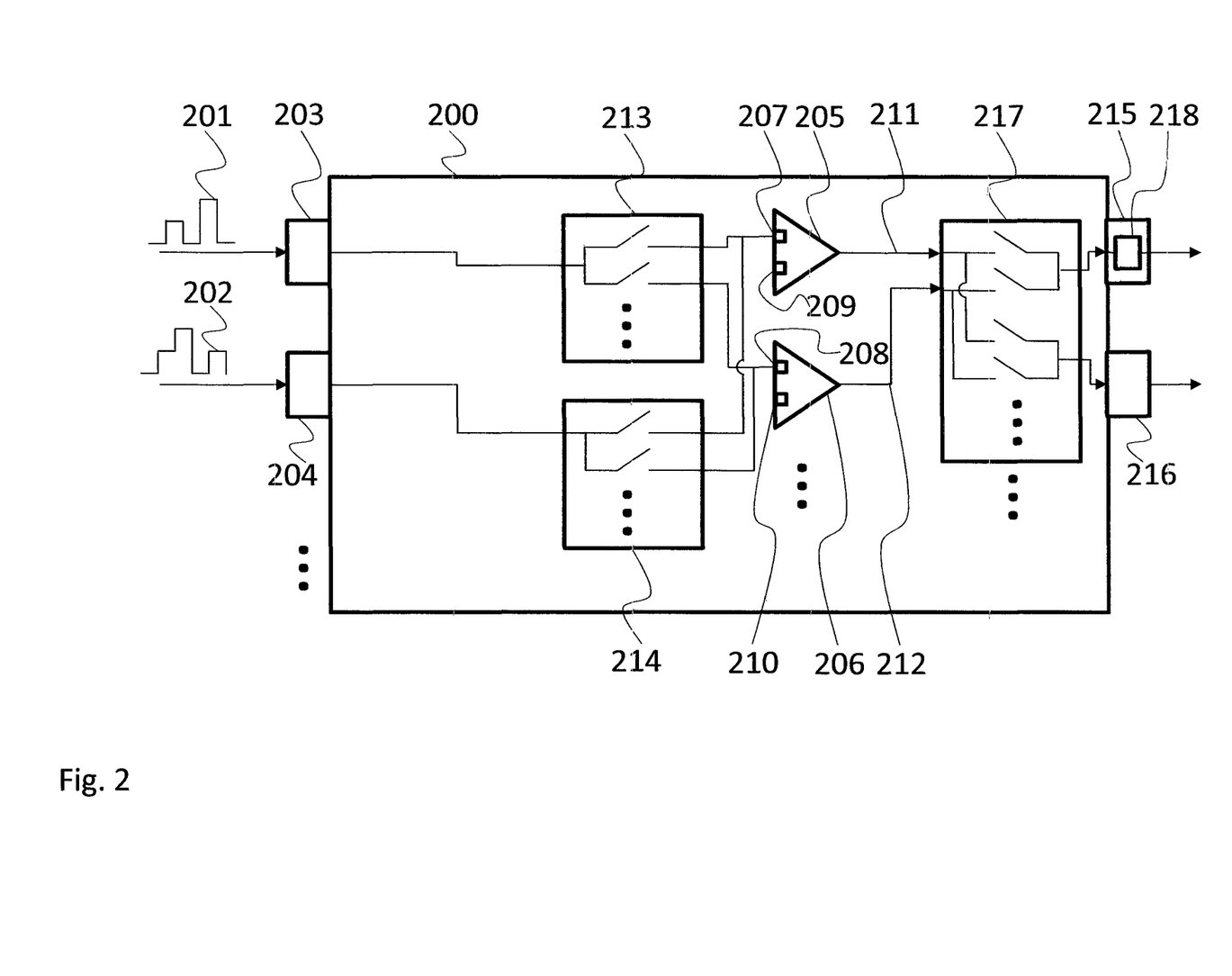
FIG. 2 shows a block diagram of another embodiment of a multi-level logic analyzer according to the present invention.

FIG. 2 shows a block diagram of another multi-level logic analyzer 200. The multi-level logic analyzer 200 is based on the multi-level logic analyzer 100 and therefore also comprises signal inputs 203, 204, first switching means 213, 214, comparison units 205, 206, and the signal outputs 215, 216. The above description also applies to these elements of the multi-level logic analyzer 200.

In addition, the multi-level logic analyzer 200 comprises second switching means 217 that are coupled between the comparison units 205, 206 and the signal outputs 215, 216. Only one second switching means 217 is shown. However it is understood, that as many second switching means 217 may be provided as necessary to process multiple multi-level digital signals 201, 202.

The second switching means 217 may controllably couple the comparison units 205, 206, which are coupled on their first comparison input with the same signal input 203, 204, on their output side with one of the signal outputs 215, 216. This means that the comparator output signals 211, 212 of multiple comparison units 205, 206 are provided to a single signal output 215, 216, if they process the same multi-level digital signal 201, 202. In the example of FIG. 1, the first switching means 213 provides the multi-level digital signal 201 to the two comparison units 205, 206. Therefore, the second switching means 217 may provide the comparator output signals 211, 212 e.g. to the same signal output 215. The signal output 215 comprises an encoder 218. Even if it is not expressly shown, it is clear that all other signal outputs may also comprise an encoder.

The encoder 218 may encode the parallel comparator output signals 211, 212 of the respective comparison units 205, 206 into binary, e.g. parallel binary, values. As an alternative the encoder 218 may also serialize the output signals of the respective comparison units 205, 206. The encoder 218 therefore provides the signal level in a binary format that may easily be processed by any following signal processing unit.

The second switching means 217 may as an alternative couple the comparison units 205, 206 on their output side with different signal outputs 215, 216 for providing the raw comparator output signals 211, 212 to the following signal processing unit.

Figure 3:
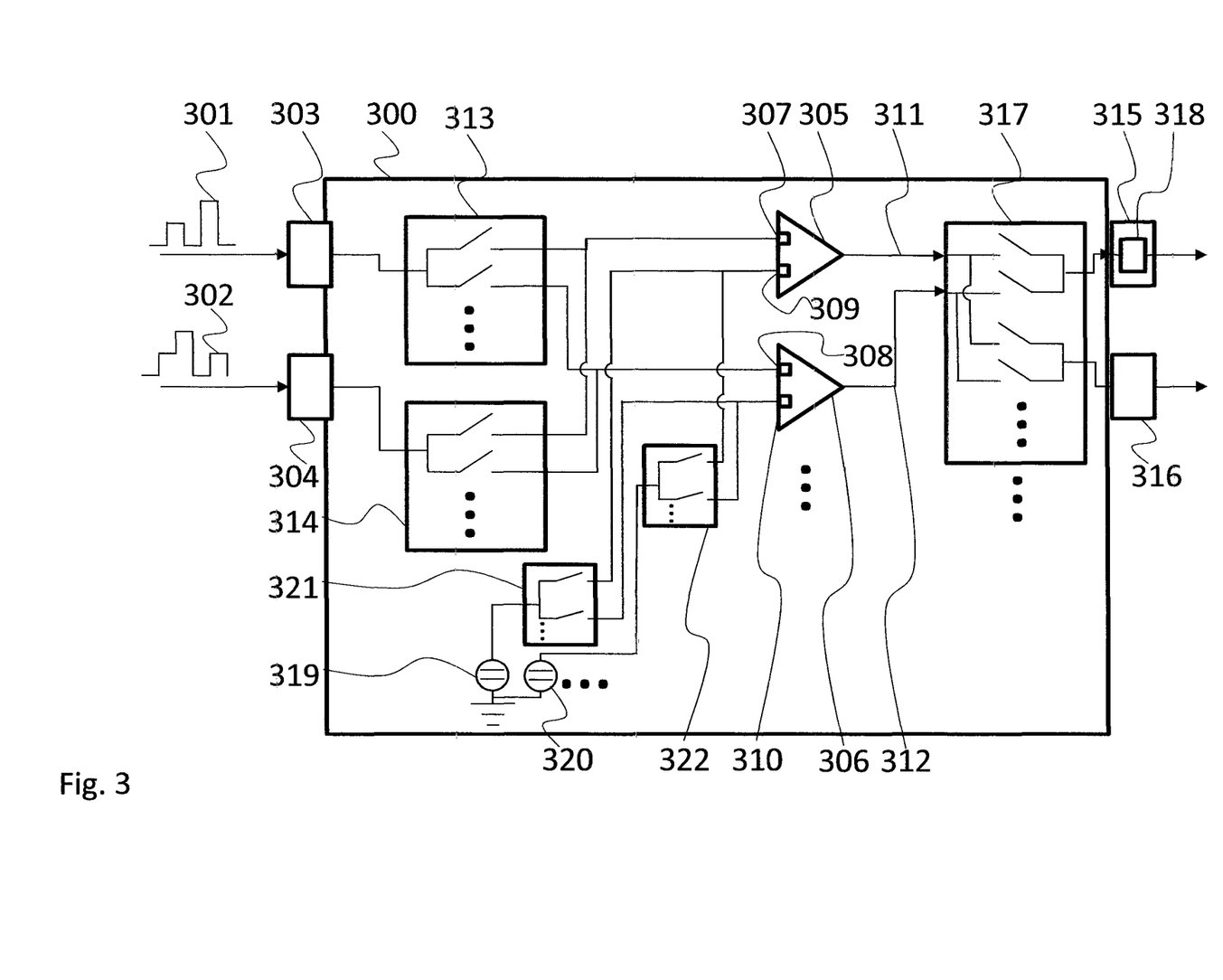
FIG. 3 shows a block diagram of another embodiment of a multi-level logic analyzer according to the present invention.

FIG. 3 shows a block diagram of another embodiment of a multi-level logic analyzer 300. The multi-level logic analyzer 300 is based on the multi-level logic analyzer 200 and therefore also comprises signal inputs 303, 304, first switching means 313, 314, comparison units 305, 306, the signal outputs 315, 316, the second switching means 317 and the encoder 318. The above description therefore also applies to these elements of the multi-level logic analyzer 300.

In addition, the multi-level logic analyzer 300 comprises a plurality of configurable threshold voltage sources 319, 320, of which for sake of clarity only two are shown. The configurable threshold voltage sources 319, 320 serve to provide to the comparison units 305, 306 the threshold voltages that they need to compare the multi-level digital signals 301, 302. It is understood, that every one of the configurable threshold voltage sources 319, 320 may provide a different voltage.

The multi-level logic analyzer 300 further comprises a plurality of third switching means 321, 322, of which only two are shown for sake of clarity. The third switching means 321, 322 may couple one of the threshold voltage sources 319, 320 with one or at least two of the comparison units 305, 306, especially when the respective two of the comparison units 305, 306 are coupled to different signal inputs 303, 304 and process different multi-level digital signals 301, 302. This will allow one configurable threshold voltage source 319, 320 to provide a threshold voltage to multiple comparison units 305, 306.

Figure 4:
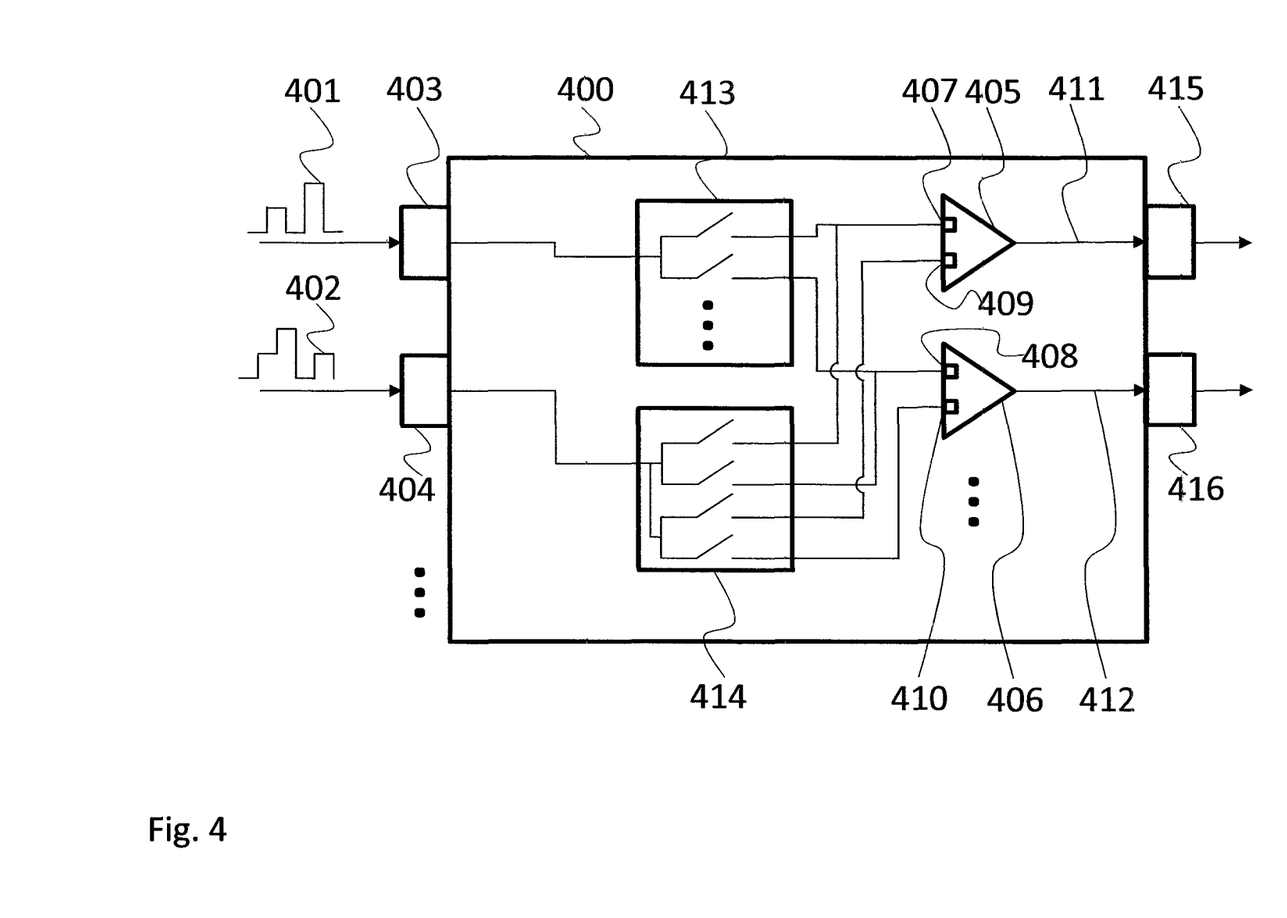
FIG. 4 shows a block diagram of another embodiment of a multi-level logic analyzer according to the present invention.

FIG. 4 shows a block diagram of another multi-level logic analyzer 400. The multi-level logic analyzer 400 is based on the multi-level logic analyzer 100 and therefore also comprises signal inputs 403, 404, first switching means 413, 414, comparison units 405, 406, and the signal outputs 415, 416. The above description also applies to these elements of the multi-level logic analyzer 400.

In addition to the multi-level logic analyzer 100, the first switching means 413, 414 of the multi-level logic analyzer 400 further may couple one of the signal inputs 403, 404 with a first comparator input 407, 408 of one of the comparison units 405, 406 and another one of the signal inputs 403, 404 with the second comparator input 409, 410 of the respective comparison unit 405, 406. This feature of the first switching means 413, 414 is shown only for the first switching means 414 but may be implemented by any other switching means.

With such first switching means 413, 414 it is possible to analyze differential multi-level digital signals 401, 402.

For sake of clarity in the following description of the method based FIG. 5 the reference signs used above in the description of apparatus based FIGS. 1-4 will be maintained.

Figure 5:
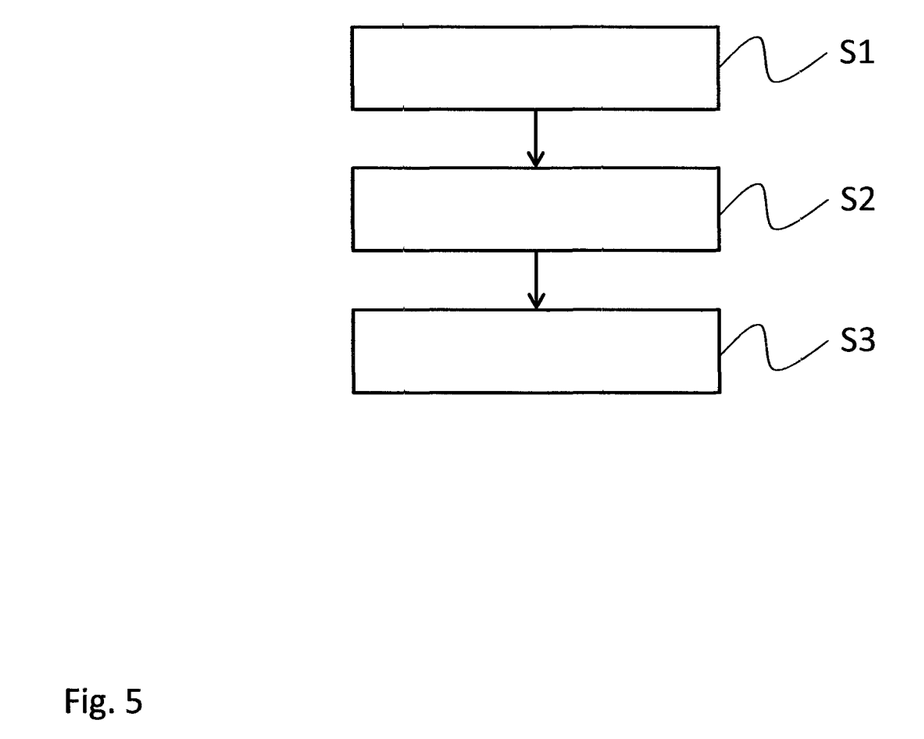
FIG. 5 shows a flow diagram of a method for operating a multi-level logic analyzer according to the present invention.

FIG. 5 shows a flow diagram of a method for operating a multi-level logic analyzer 100, 200, 300, 400 for analyzing multi-level digital signals 101, 102, 201, 202, 301, 302, 401, 402.

The method comprises receiving S1 multi-level digital signals 101, 102, 201, 202, 301, 302, 401, 402, e.g. each via a signal input 103, 104, 203, 204, 303, 304, 403, 404 of the multi-level logic analyzer 100, 200, 300, 400. The method further comprises controllably coupling S2 at least one of the signal inputs 103, 104, 203, 204, 303, 304, 403, 404 with first comparator inputs 107, 108, 207, 208, 307, 308, 407, 408 of at least two comparison units 105, 106, 205, 206, 305, 306, 405, 406. The comparison units 105, 106, 205, 206, 305, 306, 405, 406 each may comprises a first comparator input 107, 108, 207, 208, 307, 308, 407, 408 and a second comparator input 109, 110, 209, 210, 309, 310, 409, 410. Finally, the method also comprises comparing S3 the signal received at the first comparator input 107, 108, 207, 208, 307, 308, 407, 408 of a respective comparison unit 105, 106, 205, 206, 305, 306, 405, 406 with a signal received at the second comparator input 109, 110, 209, 210, 309, 310, 409, 410 of the respective comparison unit 105, 106, 205, 206, 305, 306, 405, 406. The comparator output signals 111, 112, 211, 212, 311, 312, 411, 412 may e.g. be output with a plurality of signal outputs 115, 116, 215, 216, 315, 316, 415, 416.

With the present method, a single multi-level digital signal 101, 102, 201, 202, 301, 302, 401, 402 will be provided to at least two comparison units 105, 106, 205, 206, 305, 306, 405, 406 and may therefore be analyzed for multiple signal levels at the same time by the at least two comparison units 105, 106, 205, 206, 305, 306, 405, 406.

For the processing of differential multi-level digital signals 101, 102, 201, 202, 301, 302, 401, 402, the method may comprise coupling one of the signal inputs 103, 104, 203, 204, 303, 304, 403, 404 with a first comparator input 107, 108, 207, 208, 307, 308, 407, 408 of one of the comparison units 105, 106, 205, 206, 305, 306, 405, 406 and another one of the signal inputs 103, 104, 203, 204, 303, 304, 403, 404 with the second comparator input 109, 110, 209, 210, 309, 310, 409, 410 of the respective comparison unit 105, 106, 205, 206, 305, 306, 405, 406.

The method may comprise controllably coupling comparison units 105, 106, 205, 206, 305, 306, 405, 406 that are coupled on their first comparison input with the same signal input 103, 104, 203, 204, 303, 304, 403, 404 on their output side with one of the signal outputs 115, 116, 215, 216, 315, 316, 415, 416. The output signals of the comparison units 105, 106, 205, 206, 305, 306, 405, 406 that are connected to one of the signal outputs 115, 116, 215, 216, 315, 316, 415, 416 may then be encoded into binary values or serialized.

In addition, the method may comprise controllably coupling comparison units 105, 106, 205, 206, 305, 306, 405, 406 that are coupled on their input side with a single signal input 103, 104, 203, 204, 303, 304, 403, 404 on their output side with different signal outputs 115, 116, 215, 216, 315, 316, 415, 416.

In order to perform a comparison of the multi-level digital signals 101, 102, 201, 202, 301, 302, 401, 402 configured output voltages may be provided with a plurality of configurable threshold voltage sources 319, 320. In addition one of the threshold voltage sources 319, 320 may e.g. be coupled with at least two of the comparison units 105, 106, 205, 206, 305, 306, 405, 406, especially when the respective two of the comparison units 105, 106, 205, 206, 305, 306, 405, 406 are coupled to different signal inputs 103, 104, 203, 204, 303, 304, 403, 404.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS 100, 200, 300, 400 multi-level logic analyzer
101, 102, 201, 202, 301, 302 multi-level digital signal
401, 402 multi-level digital signal
103, 104, 203, 204, 303, 304 signal input
403, 404 signal input
105, 106, 205, 206, 305, 306 comparison unit
405, 406 comparison unit
107, 108, 207, 208, 307, 308 first comparator input
407, 408 first comparator input
109, 110, 209, 210, 309, 310 second comparator input
409, 410 second comparator input
111, 112, 211, 212, 311, 312 comparator output
411, 412 comparator output
113, 114, 213, 214, 313, 314 first switching means
413, 414 first switching means
115, 116, 215, 216, 315, 316 signal output
415, 416 signal output
217, 317 second switching means
218, 318 encoder
319, 320 threshold voltage source
321, 322 third switching means
S1-S3 method steps

The invention claimed is:

1. A multi-level logic analyzer for analyzing multi-level digital signals, the multi-level logic analyzer comprising:
a plurality of signal inputs, each signal input being configured to receive a multi-level digital signal,
a plurality of signal outputs, each signal output being configured to output an output signal;
a plurality of comparison units, each comparison unit comprising a first comparator input and a second comparator input and being configured to compare a signal received at the first comparator input with a signal received at the second comparator input,
first switching means configured to couple at least one of the signal inputs with the first comparator inputs of at least two of the comparison units, and
second switching means configured to controllably couple comparison units that are coupled on their first comparison input with the same signal input on their output side with one of the signal outputs, and
wherein the signal outputs comprise an encoder that encodes output signals of the comparison units that are connected to the respective signal output into binary values or serializes the output signals of the respective comparison units.

2. The multi-level logic analyzer according to claim 1, wherein the second switching means are further configured to controllably couple comparison units that are coupled on their input side with a single signal input on their output side with different signal outputs.

3. The multi-level logic analyzer according to claim 1, comprising a plurality of configurable threshold voltage sources, each threshold voltage source being configured to provide a configured output voltage.

4. The multi-level logic analyzer according to claim 3, comprising a plurality of third switching means being configured to couple one of the threshold voltage sources with at least two of the comparison units, especially when the respective two of the comparison units are coupled to different signal inputs.

5. The multi-level logic analyzer according to claim 3, wherein the threshold voltage sources are configured to each output a different threshold voltage.

6. The multi-level logic analyzer according to claim 1, wherein the first switching means are further configured to couple one of the signal inputs with a first comparator input of one of the comparison units and one of the signal inputs with the second comparator input of the respective comparison unit.

7. A Method for operating a multi-level logic analyzer for analyzing multi-level digital signals, the method comprising:
receiving multi-level digital signals, each with a signal input,
controllably coupling at least one of the signal inputs with first comparator inputs of at least two comparison units, each comparison unit comprising a first comparator input and a second comparator input,
comparing the signal received at the first comparator input of a respective comparison unit with a signal received at the second comparator input of a respective comparison unit,
output an output signal with a plurality of signal out-puts, and
controllably coupling comparison units that are coupled on their first comparison input with the same signal input on their output side with one of the signal outputs, and
encoding the output signals of the comparison units that are connected to one of the signal outputs into binary values or serializing the output signals of the respective comparison units, especially in the respective signal outputs.

8. The method according to claim 7, comprising controllably coupling comparison units that are coupled on their input side with a single signal input on their output side with different signal outputs.

9. The method according to claim 7, comprising providing configured output voltages with a plurality of configurable threshold voltage sources.

10. The method according to claim 9, comprising coupling one of the threshold voltage sources with at least two of the comparison units, especially when the respective two of the comparison units are coupled to different signal inputs.

11. The method according to claim 9, wherein the threshold voltage sources each output a different threshold voltage.

12. The method according to claim 7, comprising coupling one of the signal inputs with a first comparator input of one of the comparison units and one of the signal inputs with the second comparator input of the respective comparison unit.

* * * * *